(12) United States Patent
Blatchford

(10) Patent No.: US 10,840,250 B2
(45) Date of Patent: Nov. 17, 2020

(54) SRAM LAYOUT FOR DOUBLE PATTERNING

(71) Applicant: Texas Instruments Incorporated, Dallas, TX (US)

(72) Inventor: James Walter Blatchford, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 159 days.

(21) Appl. No.: 16/211,753

(22) Filed: Dec. 6, 2018

(65) Prior Publication Data

US 2019/0109143 A1     Apr. 11, 2019

Related U.S. Application Data

(63) Continuation of application No. 13/622,971, filed on Sep. 19, 2012, now Pat. No. 10,181,474.

(60) Provisional application No. 61/536,346, filed on Sep. 19, 2011.

(51) Int. Cl.
| | | |
|---|---|---|
| H01L 27/11 | (2006.01) |
| H01L 27/02 | (2006.01) |
| H01L 21/027 | (2006.01) |
| H01L 21/311 | (2006.01) |
| H01L 21/768 | (2006.01) |

(52) U.S. Cl.
CPC ...... *H01L 27/1104* (2013.01); *H01L 21/0274* (2013.01); *H01L 21/31144* (2013.01); *H01L 21/76802* (2013.01); *H01L 21/76877* (2013.01); *H01L 27/0207* (2013.01); *H01L 27/1108* (2013.01)

(58) Field of Classification Search
None
See application file for complete search history.

(56) References Cited

U.S. PATENT DOCUMENTS

| | | | |
|---|---|---|---|
| 6,303,422 B1 | 10/2001 | Abe et al. | |
| 7,786,017 B1 | 8/2010 | Morgenfeld et al. | |
| 2005/0191578 A1* | 9/2005 | Araki | G03C 1/492 430/270.1 |
| 2006/0203530 A1* | 9/2006 | Venkatraman | H01L 27/11 365/49.15 |
| 2009/0153826 A1 | 6/2009 | Sewell et al. | |
| 2009/0160064 A1 | 6/2009 | Jeong | |
| 2010/0283152 A1 | 11/2010 | Chen et al. | |
| 2011/0068400 A1* | 3/2011 | Wang | G11C 11/412 257/347 |
| 2011/0183505 A1 | 7/2011 | Min et al. | |
| 2011/0317485 A1* | 12/2011 | Liaw | G11C 8/16 365/182 |
| 2012/0049286 A1 | 3/2012 | Beyer et al. | |
| 2012/0156881 A1 | 6/2012 | Haffner | |

(Continued)

*Primary Examiner* — Vongsavanh Sengdara
(74) *Attorney, Agent, or Firm* — Jacqueline J. Garner; Charles A. Brill; Frank D. Cimino

(57) ABSTRACT

An integrated circuit with a SAR SRAM cell with power routed in metal-1. An integrated circuit with a SAR SRAM cell that has power routed in Metal-1 and has metal-1 and metal-2 integrated circuit and SAR SRAM cell patterns which are DPT compatible. A process of forming an integrated circuit with a SAR SRAM cell with DPT compatible integrated circuit and SAR SRAM cell metal-1 and metal-2 patterns.

12 Claims, 14 Drawing Sheets

(56) References Cited

U.S. PATENT DOCUMENTS

2012/0256235 A1  10/2012  Pan et al.
2013/0242645 A1* 9/2013  Calhoun ............ H01L 21/28088
                                            365/154

* cited by examiner

SRAM LAYOUT FOR DOUBLE PATTERNING

CROSS REFERENCE TO RELATED APPLICATIONS

This application is a continuation of U.S. Nonprovisional patent application Ser. No. 13/622,971, filed Sep. 19, 2012, which claims the benefit of U.S. Provisional Application Ser. No. 61/536,346, filed Sep. 19, 2011, the contents of both of which are herein incorporated by reference in its entirety.

This invention relates to the field of integrated circuit manufacturing. More particularly, this invention relates to double patterning photolithography for SAR SRAM cells.

BACKGROUND

The features in integrated circuit manufacture have continued to be reduced in size, while the wavelength of the light used to print these features has remained at about 193 nm. The resolution of these features in a photoresist pattern begins to blur at a pitch of about 100 nm. To enable manufacture of integrated circuits with smaller feature sizes, double patterning techniques (DPT) have been developed.

In double patterning technology one mask with a pitch (geometry width plus space between geometries) of about 50 nm may be decomposed into two masks, each with a pitch of about 100 nm. In a single patterning technology the space between two geometries is typically limited by photolithography. By decomposing the single pattern into two patterns, spaces approximately half the space of a single pattern technology may be formed using double patterning technology resulting in a significant reduction in chip area.

One DPT method is to pattern and etch a given layer using a first mask and then to pattern and etch the same layer using a second mask. Another DPT method is to first expose the first mask in a photoresist layer and then expose the second mask in the same photoresist layer prior to etching.

DPT technology becomes especially challenging for SRAM cells where geometries are often pushed significantly below the minimum allowed design rules for random logic. Techniques used to ensure a given mask level is DPT compatible are generally inadequate for SRAM cells.

A circuit diagram of a typical 6 transistor (6-T) SRAM cell is shown in FIG. 1. The 6-T SRAM cell consists of two inverters with cross coupled gates. A first inverter is composed of pullup PMOS transistor 28 and pulldown NMOS transistor 22. A second inverter is composed of pullup PMOS transistor 34 and pulldown NMOS transistor 38. Both inverters are connected between power (Vdd) 30 and ground (Vss) 20. The gate of the first inverter 42 is connected to the storage node (SN2) of the second inverter and the gate of the second inverter 40 is connected to the storage node (SN1) of the first inverter. Pass transistor 24 connects the storage node (SN1) of the first inverter to the first bitline 26 and pass transistor 38 connects the storage node (SN2) of the second inverter to the second bitline 36. The gates of the pass transistors, 24 and 38 are connected to wordline 32.

When the voltage on SN2 is low, because SN2 is coupled to the gate 42 of the first inverter, the voltage on the gate is also low so the NMOS transistor 22 of the first inverter is off and the PMOS transistor 28 of the first inverter is on. Since the PMOS transistor 28 is connected to Vdd 30 and is turned on, the storage node of the first inverter (SN1) is charged to approximately at Vdd. SN1 is coupled to the gate 40 of the second inverter so the NMOS transistor 38 of the second inverter is on and the PMOS transistor 34 of the second inverter is off. The storage node of the second inverter (SN2) is discharged through NMOS transistor 38 to approximately ground 20.

A top-down view of the active, gate, contact, and metal1 patterns of a typical small aspect ratio (SAR) SRAM cell are shown in FIG. 2. Top-down views of the active (FIG. 3A), gate (FIG. 3B), contact (FIG. 3C), metal1 (FIG. 3D), via-1 (FIG. 3E), and metal-2 (FIG. 3F) patterns are shown in FIGS. 3A through 3F. While it may be possible to decompose the active (3A), gate (3B), contact (3C), and via-1 (3E) patterns into two patterns compatible with double patterning technology (DPT), the wiring levels metal-1 (3D) and metal-2 (3F) are not DPT compatible. It is impossible to decompose the metal-1 pattern (3D) into a two color pattern with no design rule conflicts. Likewise it is impossible to decompose the metal-2 pattern (3F) into a two color pattern with no design rule conflicts. The size of the SAR SRAM cell is therefore limited by the metal-1 and metal-2 patterns. For a 20 nm technology node the area of SAR SRAM cell is limited to about 0.08 um$^2$ or greater.

SUMMARY

An integrated circuit with a SAR SRAM cell with power routed in metal-1. An integrated circuit with a SAR SRAM cell that has power routed in Metal-1 and has metal-1 and metal-2 integrated circuit and SAR SRAM cell patterns which are DPT compatible. A process of forming an integrated circuit with a SAR SRAM cell with DPT compatible integrated circuit and SAR SRAM cell metal-1 and metal-2 patterns.

DETAILED DESCRIPTION OF EXAMPLE EMBODIMENTS

Figure 4:
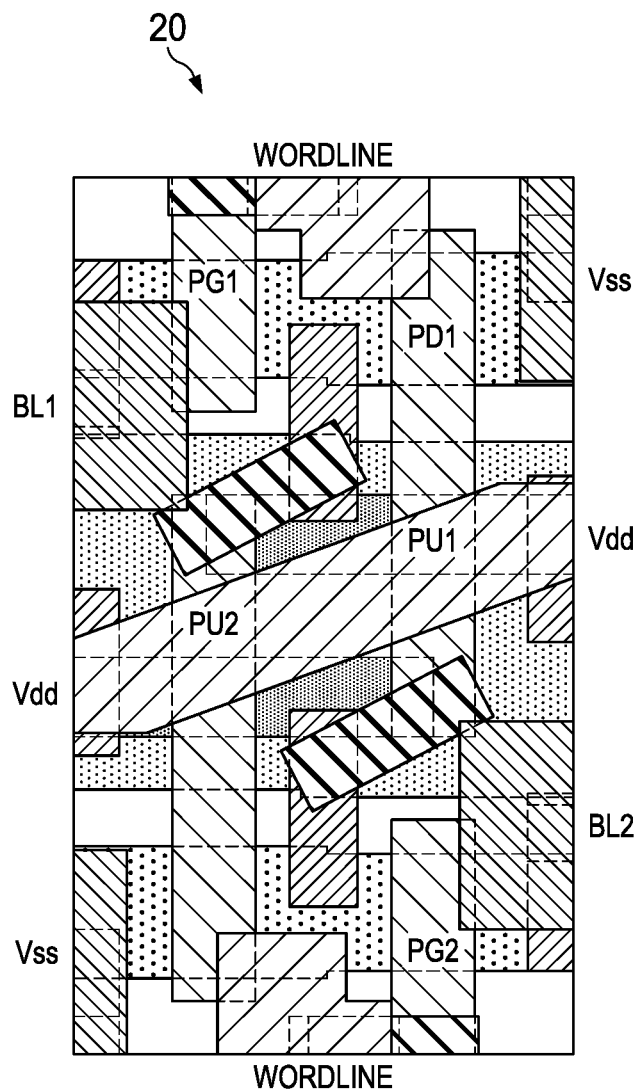
FIG. 4 is a top down view of the active, gate, contact, and metal-1 patterns of an embodiment 6 transistor SAR SRAM cell formed according to principles of the invention.

A top down view of the critical patterns through metal 1 (active, poly, contact, metal 1) of an embodiment small aspect ratio (SAR) SRAM cell that has been redesigned so that the critical patterns through metal-2 (active, gate, contact, metal-1, via-1, and metal-2) are double patterning technology (DPT) compatible is shown in FIG. 4.

Figure 1:
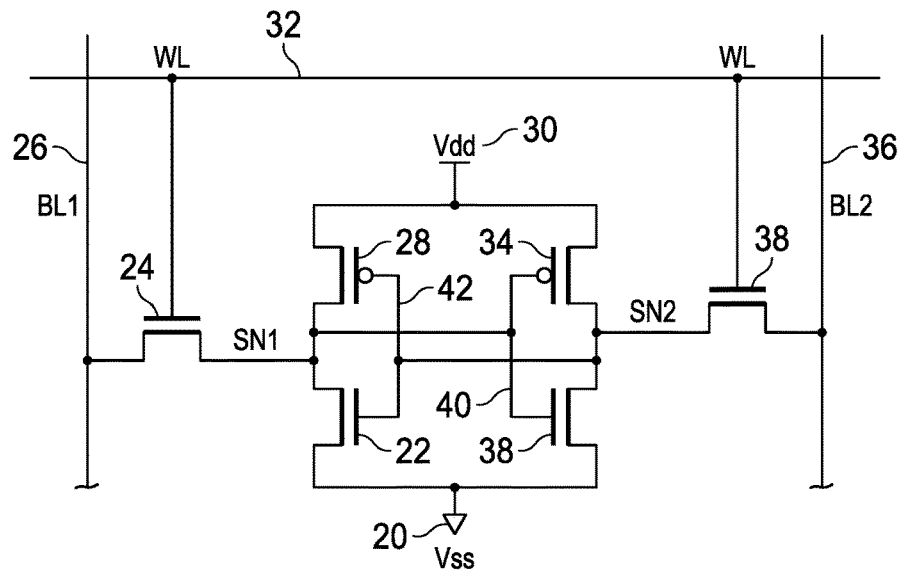
FIG. 1 (Prior art) is a circuit diagram of a 6 transistor SRAM cell.
Figure 2:
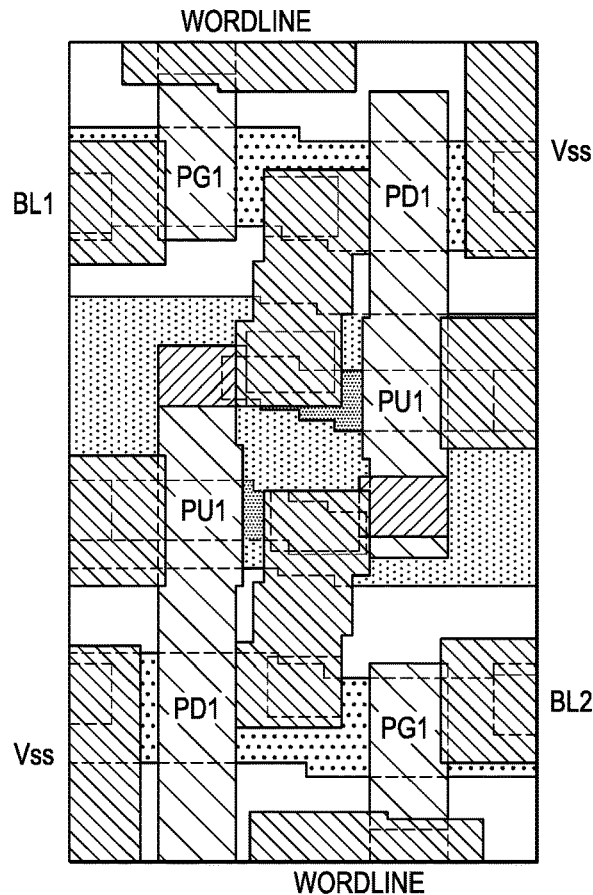
FIG. 2 (Prior art) is a top down view of the active, gate, contact, and metal-1 patterns of a conventional 6 transistor SAR SRAM cell.

A key feature of the embodiment SAR SRAM design in FIG. 4 is that unlike the conventional SAR SRAM cell shown in FIG. 2, where power (Vdd) is routed in metal-2, power in the embodiment SAR SRAM cell is routed in metal-1. Redesigning the embodiment SAR SRAM cell to move power routing to metal-1 enables the metal-1 pattern (5D) and metal-2 (5F) pattern to be laid out with DPT compatibility.

Figure 3A:
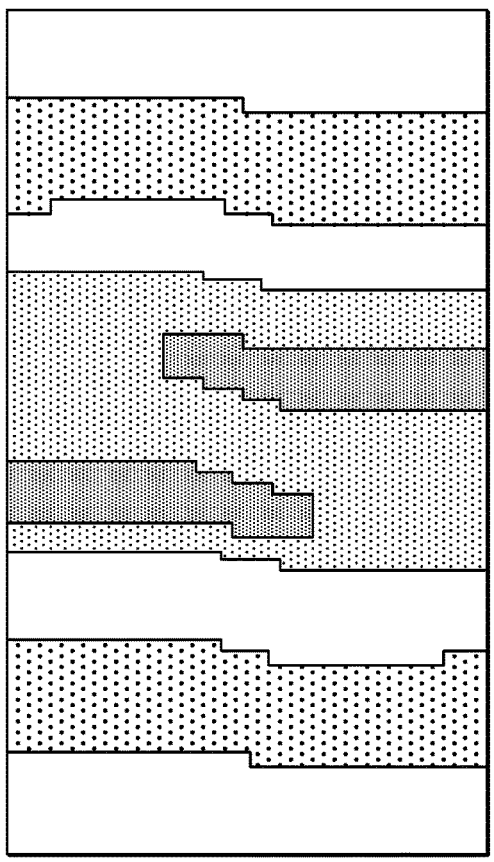
FIGS. 3A-3F (Prior art) are the active, gate, contact, metal-1, via-1, and metal-2 patterns of the 6 transistor SAR SRAM cell of FIG. 2.
Figure 3B:
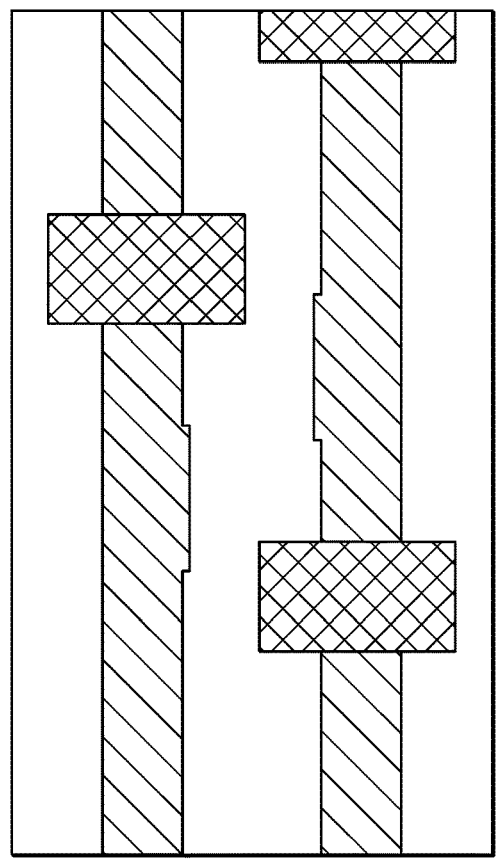
Figure 3C:
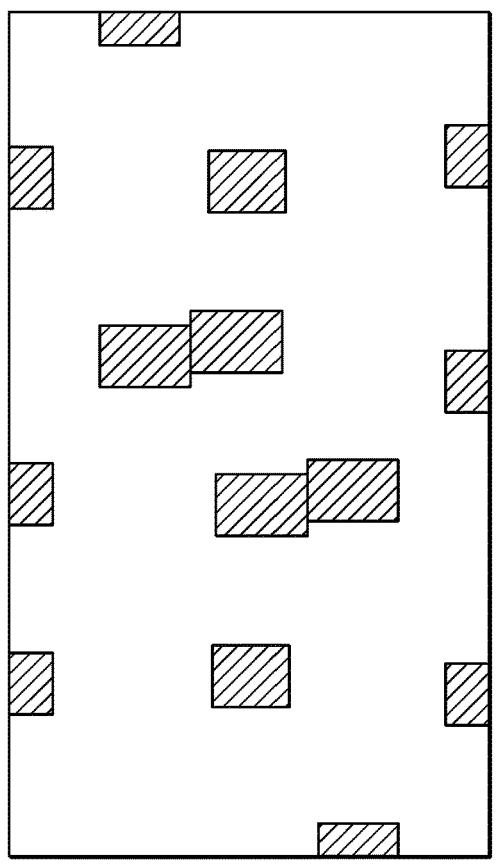
Figure 3D:
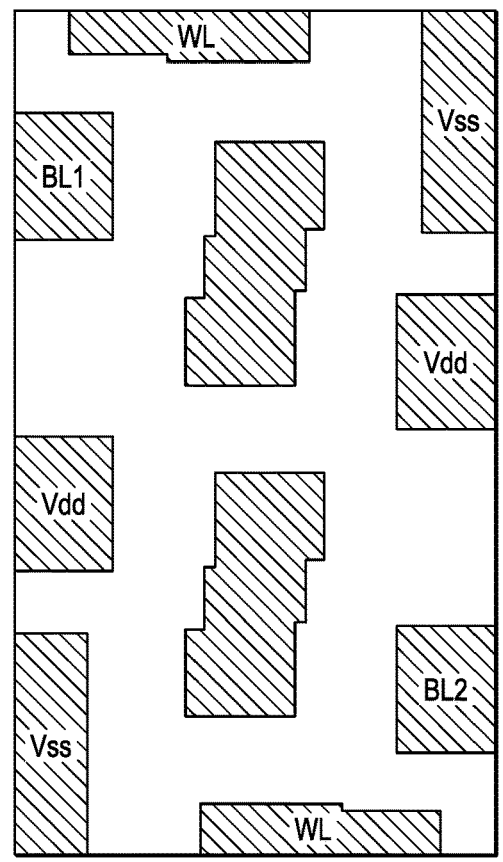
Figure 3E:
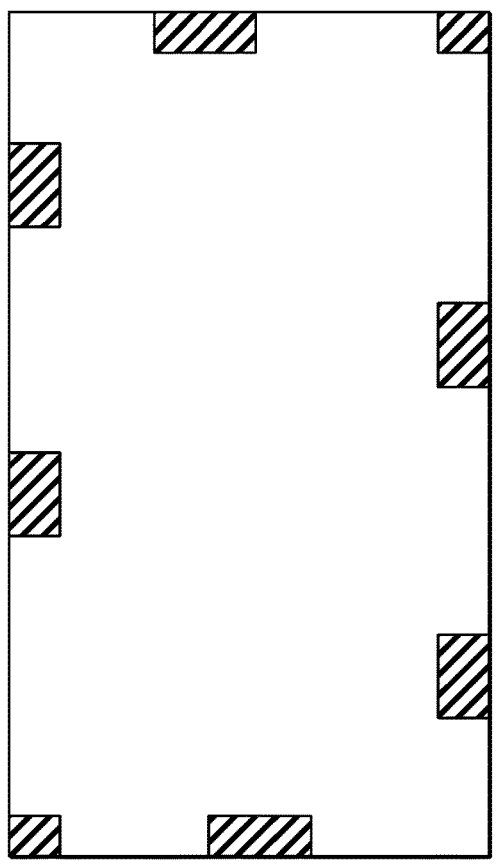
Figure 3F:
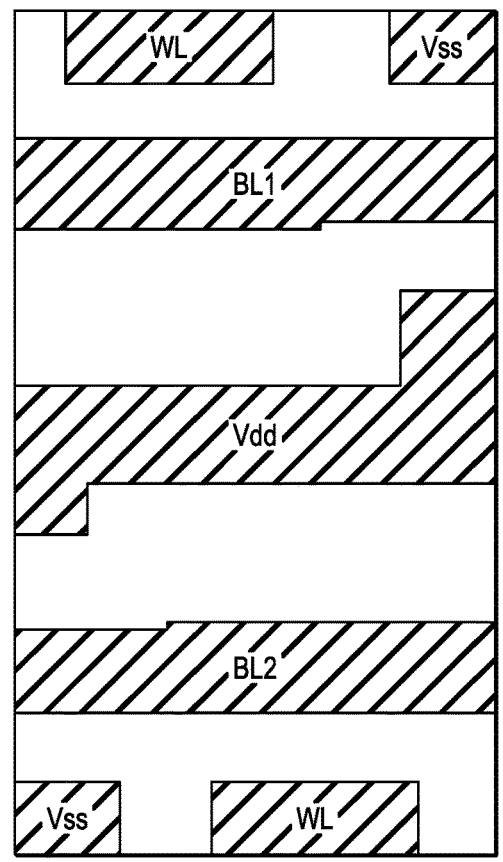

In the conventional SAR SRAM cell both the bitlines and power (Vdd) are routed in metal-2 as shown in FIG. 3F. Neither metal-1 pattern shown in FIG. 3D nor metal-2 pattern shown in FIG. 3F in the conventional SAR SRAM cell are DPT compatible.

Figure 5A:
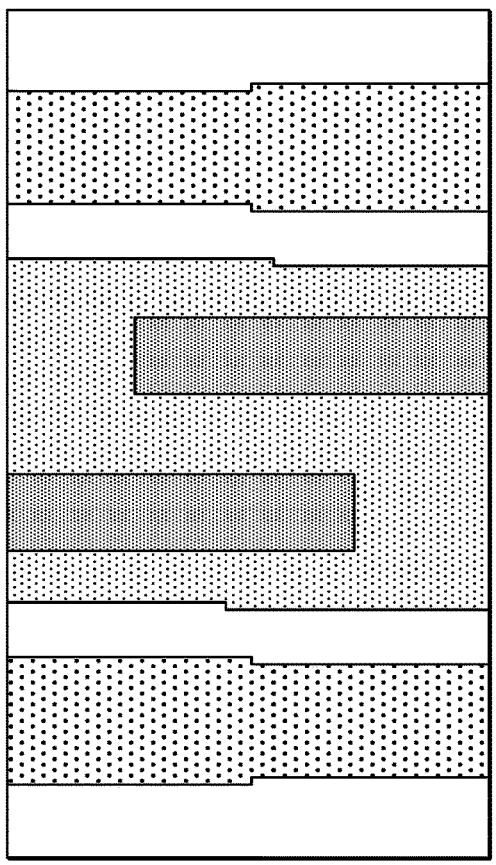
FIGS. 5A-5F are the active, gate, contact, metal-1, via-1, and metal-2 patterns of the embodiment 6 transistor SAR SRAM cell of FIG. 4 formed according to principles of the invention.
Figure 5B:
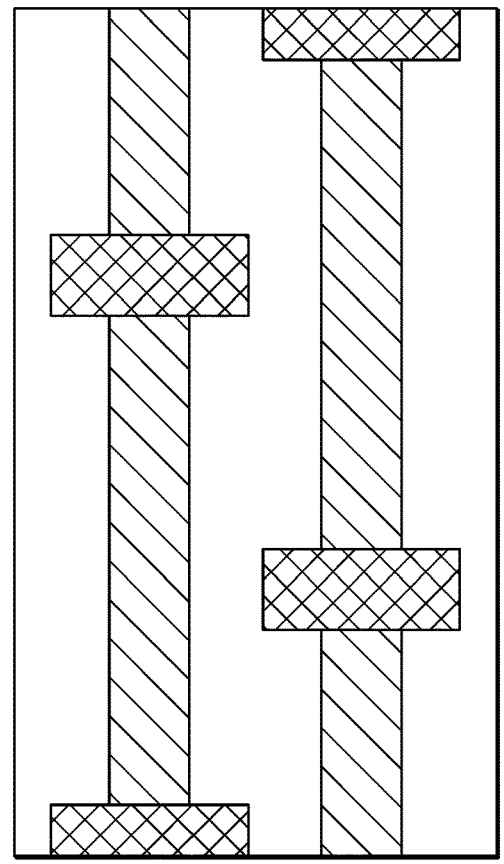
Figure 5C:
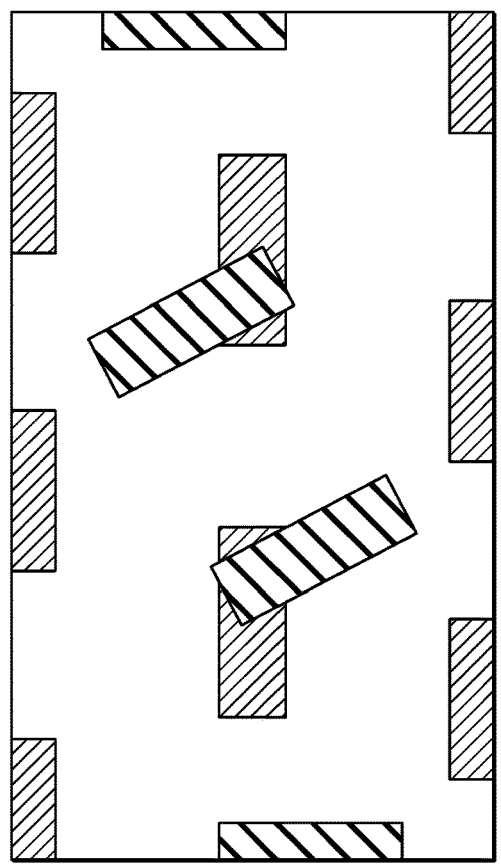
Figure 5D:
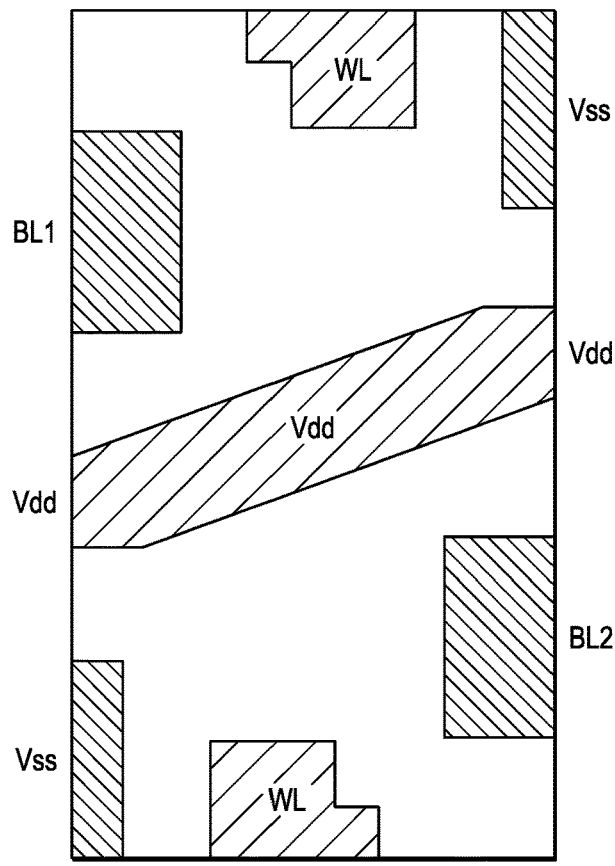
Figure 5E:
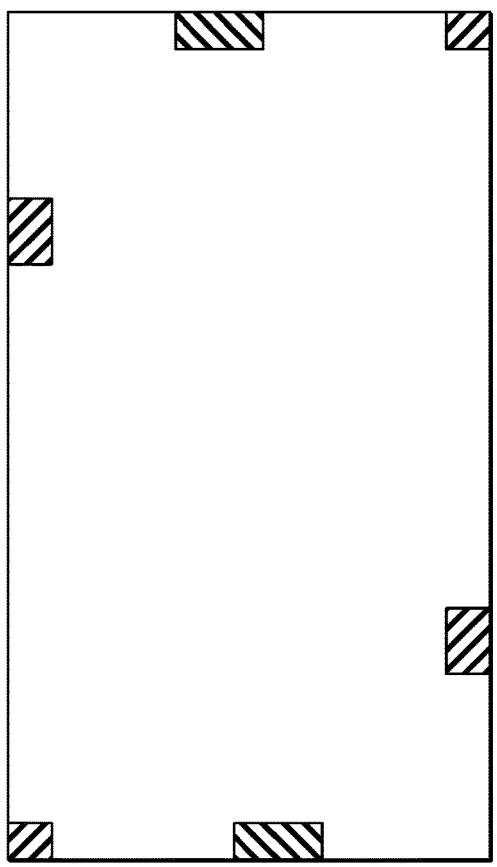
Figure 5F:
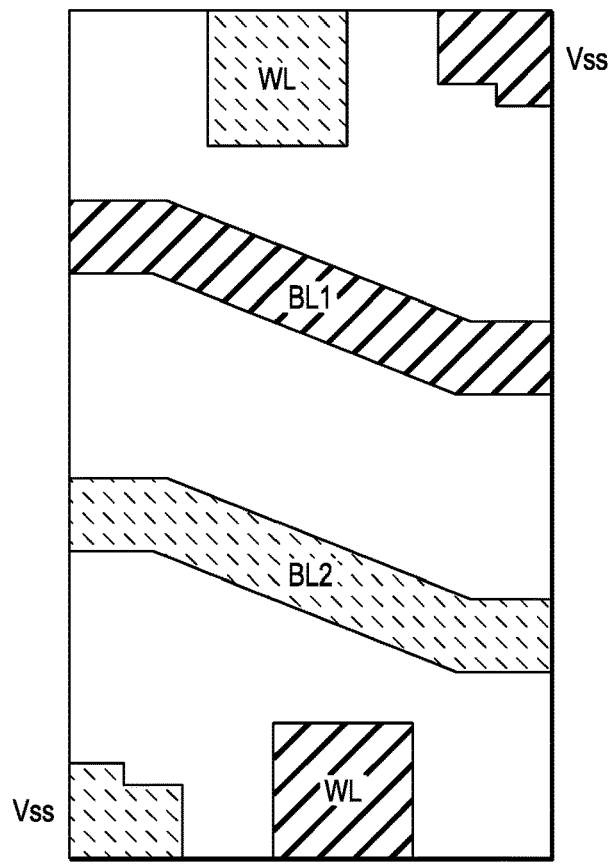

In the embodiment SAR SRAM cell the bitlines are routed in metal-2 as shown in FIG. 5F and power (Vdd) is routed in metal-1 as shown in FIG. 5D. Since these patterns are now DPT compatible, the smaller first DPT geometry to second DPT geometry space design rule may be used to reduce the size of the SRAM cell.

As shown in FIGS. 6 through 10 each of the critical patterns from gate through metal-2 of the embodiment SAR SRAM cell are DPT compatible enabling a smaller SAR SRAM cell.

Figure 6:
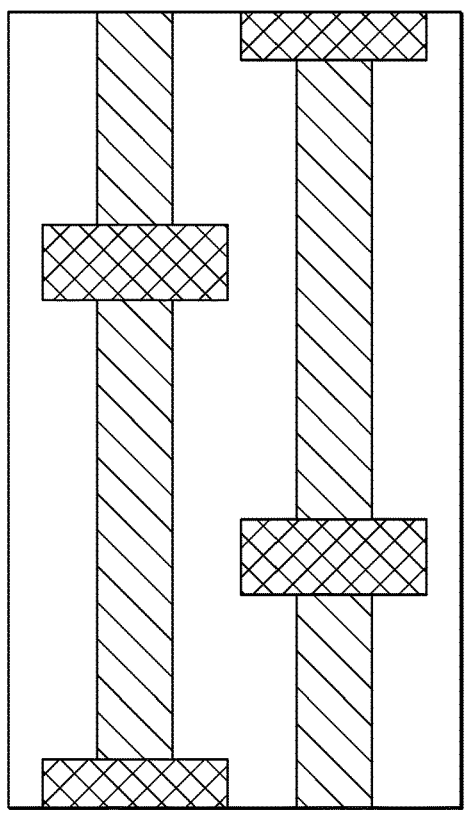
FIGS. 6, 6A, and 6B are plan views of the DPT compatible poly patterns of the embodiment SAR SRAM cell of FIG. 4.
Figure 6A:
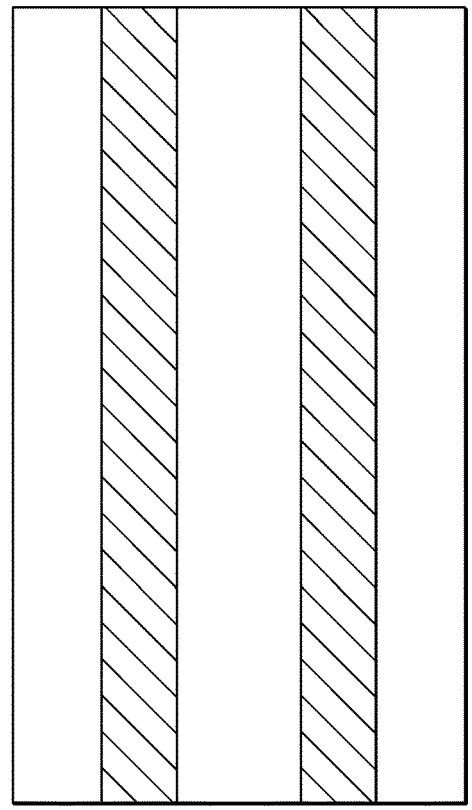
Figure 6B:
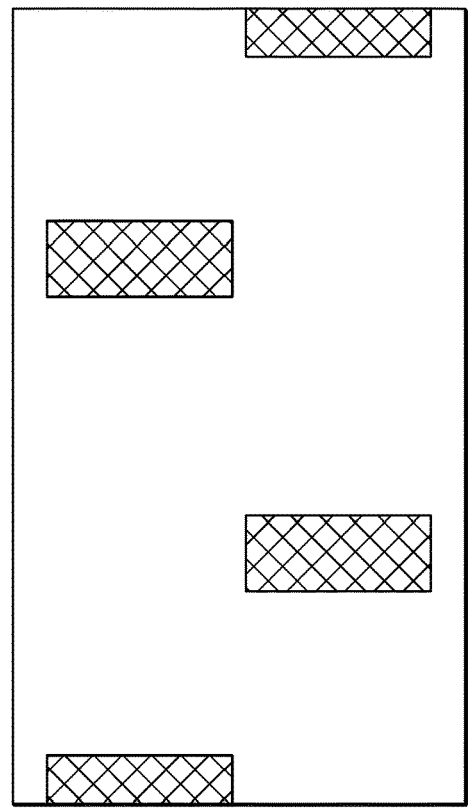

The gate level pattern in FIG. 6 may be decomposed into a first DPT gate pattern in FIG. 6A and a second DPT gate pattern in FIG. 6B.

Figure 7A:
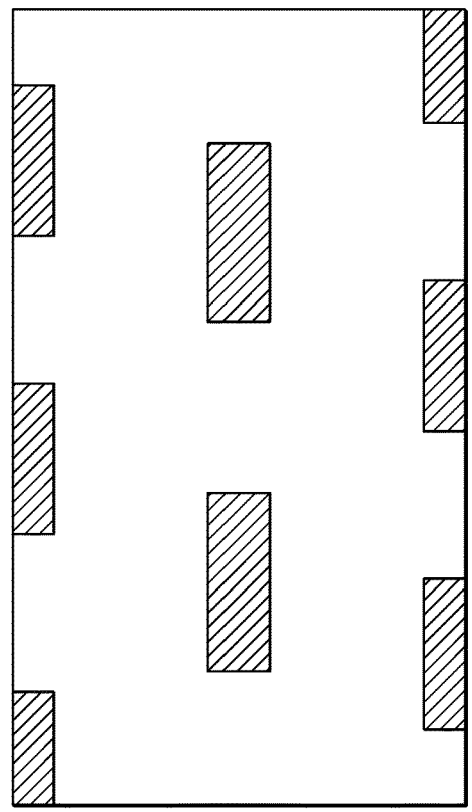
FIGS. 7, 7A, and 7B are plan views of the DPT compatible contact patterns of the embodiment SAR SRAM cell of FIG. 4 formed according to principles of the invention.
Figure 7:
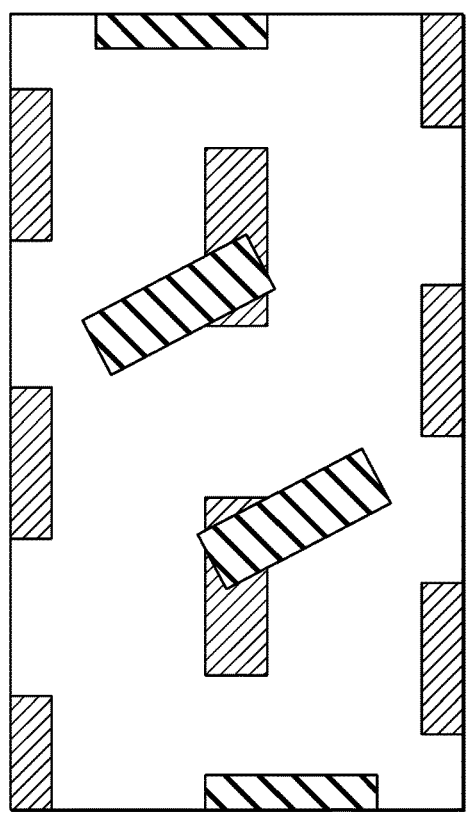
Figure 7B:
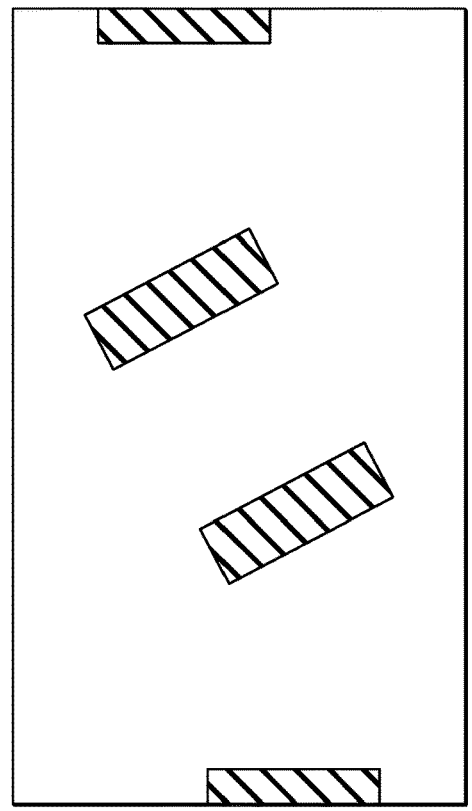

The contact level pattern in FIG. 7 may be decomposed into a first DPT contact pattern in FIG. 7A and a second DPT contact pattern in FIG. 7B.

Figure 8:
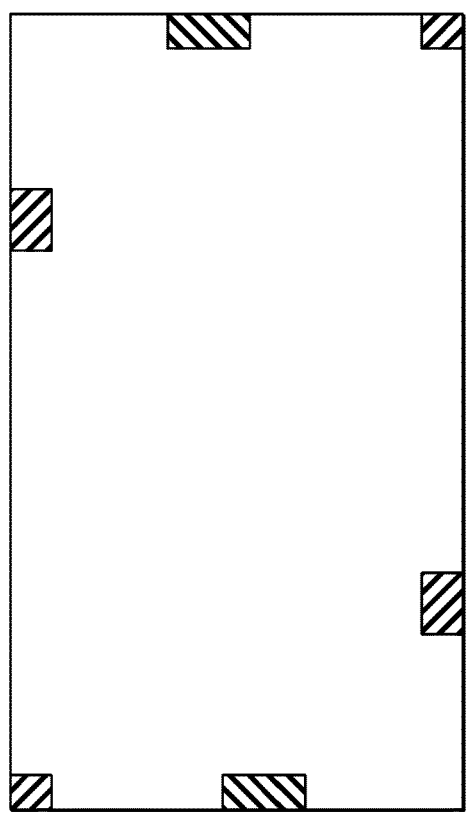
FIGS. 8, 8A, and 8B are plan views of the DPT compatible metal-1 patterns of the embodiment SAR SRAM cell of FIG. 4 formed according to principles of the invention with power routed on metal-1.
Figure 8A:
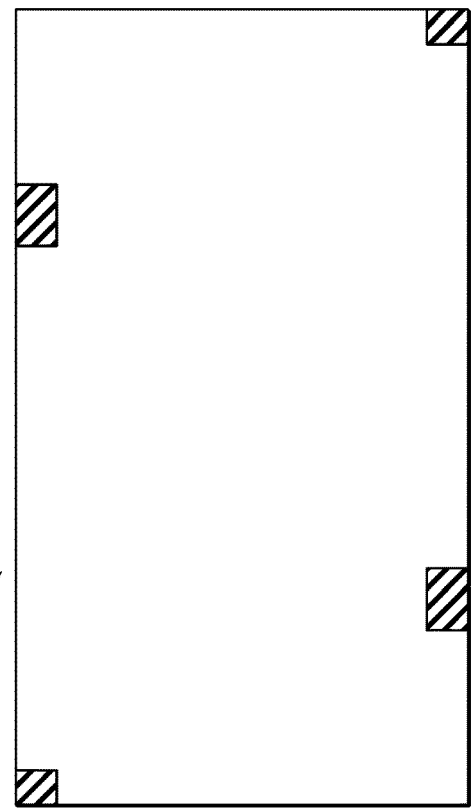
Figure 8B:
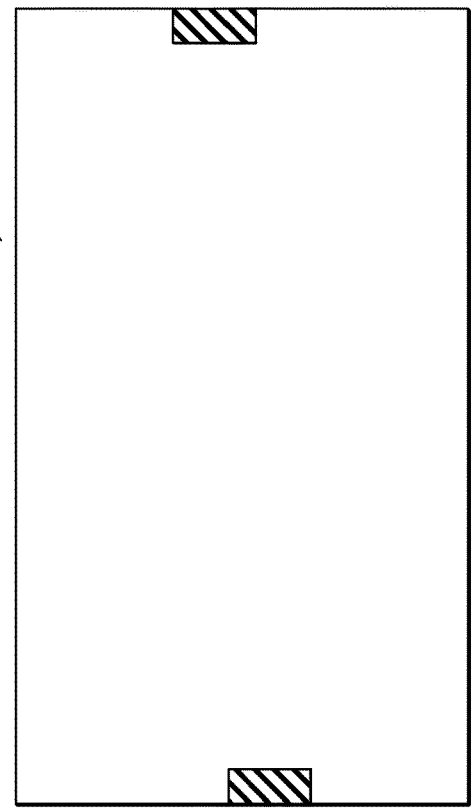

The metal-1 level pattern in FIG. 8 may be decomposed into a first DPT metal-1 pattern in FIG. 8A and a second DPT metal-1 pattern in FIG. 8B.

Figure 9:
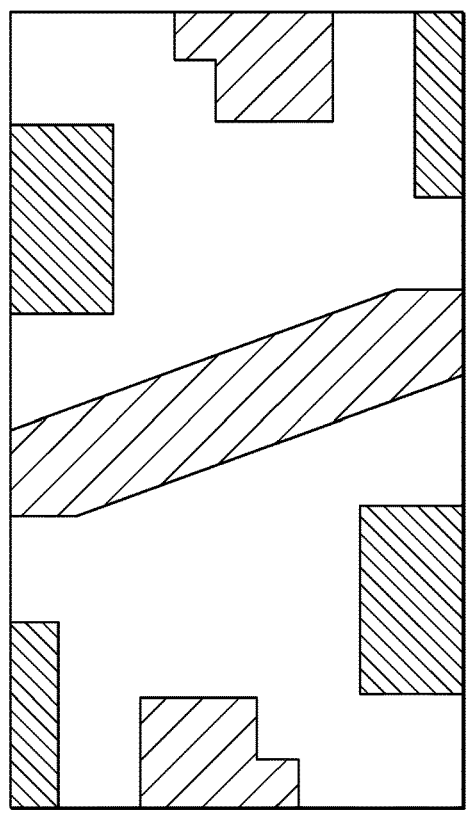
FIGS. 9, 9A, and 9B are plan views of the DPT compatible via-1 patterns of the embodiment SAR SRAM cell of FIG. 4 formed according to principles of the invention.
Figure 9A:
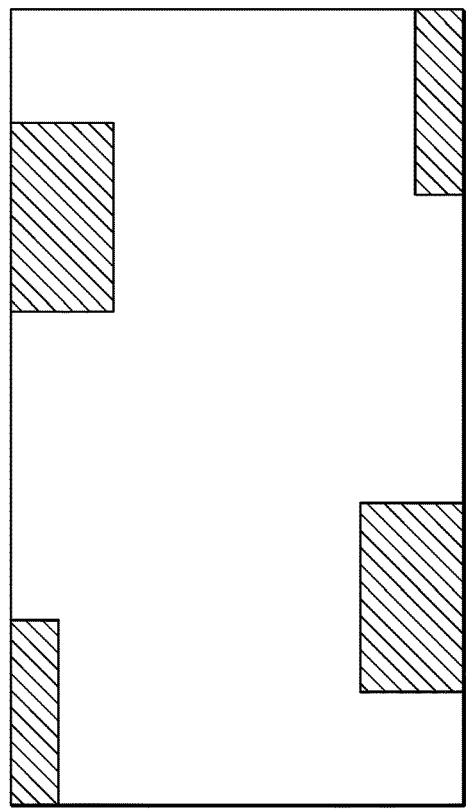
Figure 9B:
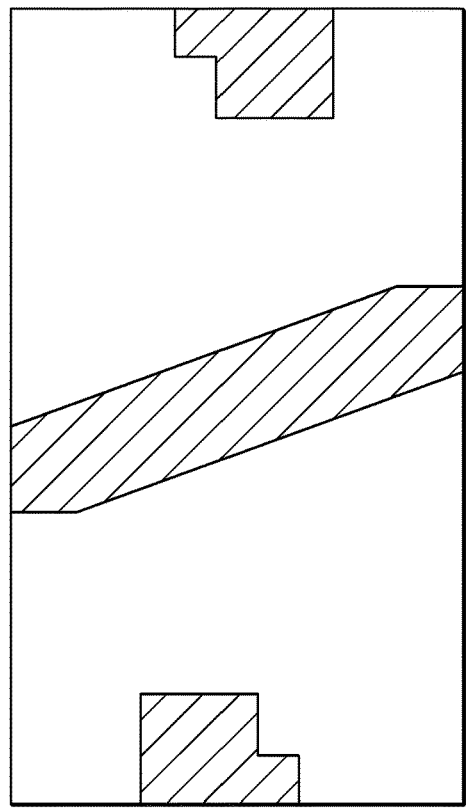

The via-1 level pattern in FIG. 9 may be decomposed into a first DPT via-1 pattern in FIG. 9A and a second DPT via-1 pattern in FIG. 9B.

Figure 10:
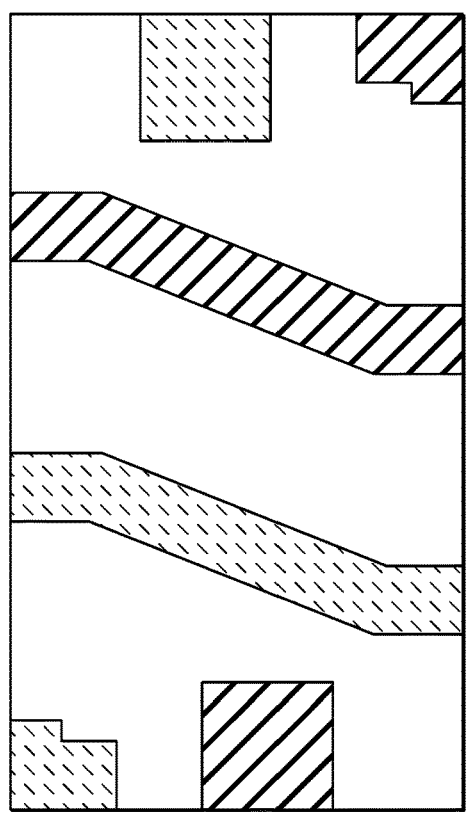
FIGS. 10, 10A, and 10B are plan views of the DPT compatible metal-2 patterns of the embodiment SAR SRAM cell of FIG. 4 formed according to principles of the invention.
Figure 10A:
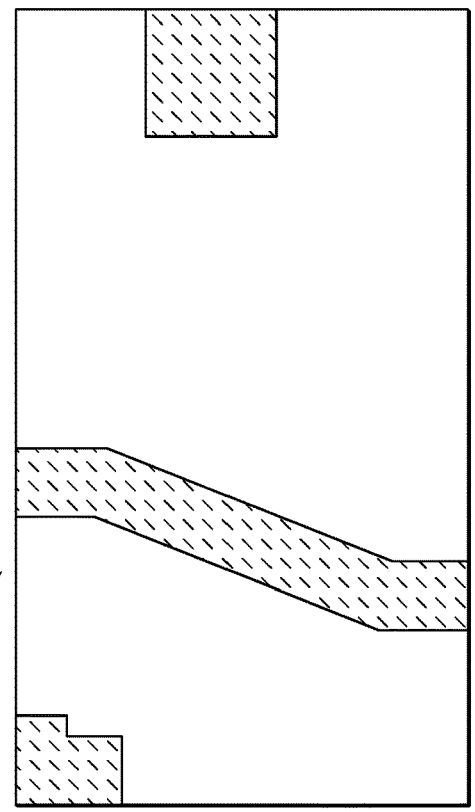
Figure 10B:
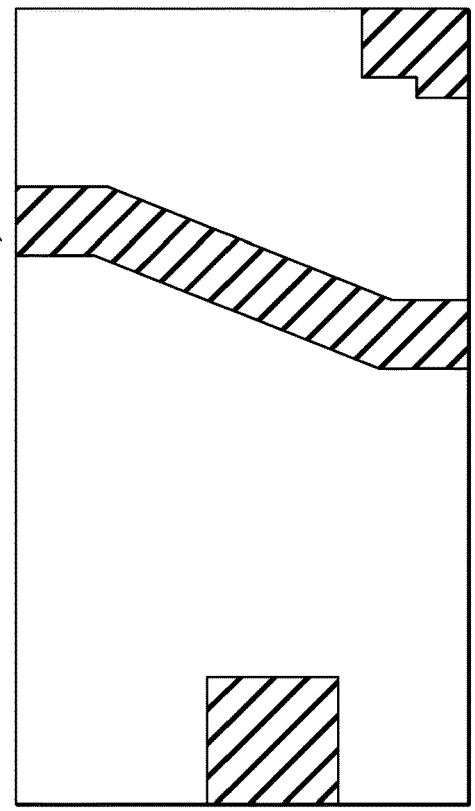

The metal-2 level pattern in FIG. 10 may be decomposed into a first DPT metal-2 pattern in FIG. 10A and a second DPT metal-2 pattern in FIG. 10B.

Redesigning the embodiment SAR SRAM cell to enable critical levels to be DPT compatible allows a smaller SAR SRAM cell size. For example, at the 20 nm technology node the conventional SAR SRAM cell in FIG. 2 whose size is limited by single pattern technology metal-1 and metal-2 patterns has a size of about 0.08 um$^2$ or larger. The size of the embodiment SAR SRAM cell in FIG. 4 may be reduced to about 0.06 um$^2$ by redesigning the SAR SRAM cell with DPT compatible critical patterns. The about 25% reduction in SAR SRAM cell size becomes a very significant area savings for integrated circuits with large SRAM memory arrays.

Figure 11:
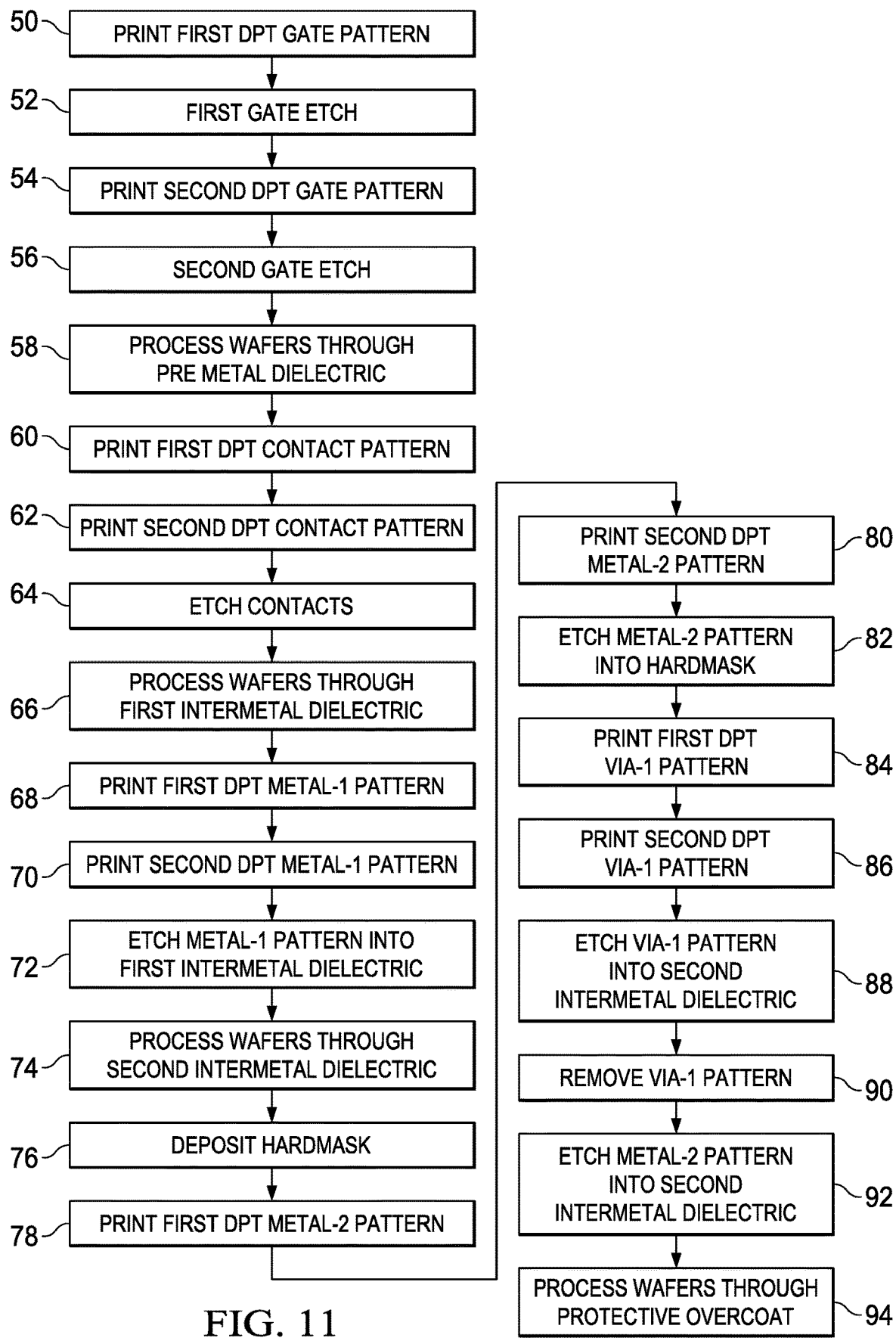
FIG. 11 is a process flow diagram which describes an embodiment process flow for forming and integrated circuit with a SAR SRAM cell according to principles of the invention.

A process flow for producing the embodiment SAR SRAM cell is shown in FIG. 11.

After an integrated circuit wafer is processed through gate poly deposition, the wafer is patterned with a first DPT poly pattern (FIG. 6A) in step 50 and the poly is etched to form gate geometries.

In step 54 a second DPT poly pattern (FIG. 6B) is applied and the poly is again etched in step 56 to cut the gate geometries separate transistor gates.

In step 58 the wafer is processed through the integrated circuit process steps between gate etch and contact pattern. These steps may include extension (LDD) pattern and implant for NMOS and PMOS transistors, sidewall dielectric deposition and etch, source and drain pattern and implant for NMOS and PMOS, silicide formation, contact etch stop deposition and premetal dielectric deposition and planarization. Other process steps such as stress memorization, dual stress liner formation may also be included.

In step 60 the wafer may be coated with resist and a first DPT contact pattern printed in the resist. Next in step 62 a second DPT contact pattern may be printed in the same resist. By printing the contact level using two DPT contact masks, tighter first DPT contact to second DPT contact space design rule may be used to reduce the size of the embodiment SAR SRAM cell. (Contact-to-contact space design rule on the same contact mask is larger than the contact-to-contact space design rule between contacts on different DPT contact masks.)

In step 64 the contacts are etched through the PMD and contact etch stop layers to form contacts to the gates and source and drain diffusion areas.

In step 66 the wafer is processed through the integrated circuit process steps between contact etch and metal-1 pattern. These steps may include contact liner deposition, contact plug deposition and planarization, and first intermetal dielectric deposition (IMD-1).

In step 68 photoresist is coated on the first intermetal dielectric and a first DPT metal-1 pattern is printed. In step 70 a second DPT metal-1 pattern is printed in the same resist. By printing the metal-1 interconnect level using a first DPT metal-1 mask and a second DPT metal-1 mask, tighter first DPT metal-1 geometry to second DPT metal-1 geometry space design rule may be used to reduce the size of the embodiment SAR SRAM cell. (Metal-1 geometry to metal-1 geometry space design rule for metal-1 geometries on the same contact mask is larger than the metal-1 geometry to metal-1 geometry space design rule between metal-1 geometries on different DPT metal-1 masks.)

In step 72 metal-1 trenches are etched into IMD-1 to form contact to the underlying contact plugs.

In step 74 the wafer is processed through the integrated circuit process steps between metal-1 etch and metal-2 pattern. These steps may include metal-1 liner deposition, metal-1 deposition and planarization, and second intermetal dielectric deposition (IMD-2).

In step 76 a hardmask which may be a dielectric such as SiN or silicon carbide may be deposited.

In step 78 photoresist is coated on the wafer and a first DPT metal-2 pattern is printed. In step 80 a second DPT metal-2 pattern is printed in the same resist. By printing the metal-2 interconnect level using a first DPT metal-2 mask and a second DPT metal-2 mask, tighter first DPT metal-2 geometry to second DPT metal-2 geometry space design rule may be used to reduce the size of the embodiment SAR SRAM cell. (Metal-2 geometry to metal-2 geometry space design rule for metal-2 geometries on the same contact mask is larger than the metal-2 geometry to metal-2 geometry space design rule between metal-2 geometries on different DPT metal-2 masks.)

In step 82 metal-2 pattern is etched into the hardmask.

In step 84 resist is coated on the hardmask containing the embodiment metal-2 pattern. A first DPT via-1 pattern is then printed in the resist. In step 86 a second DPT via-2 pattern is also printed in the same resist. By printing the vis-1 level using two DPT via-1 masks, tighter first DPT via-1 to second DPT via-1 space design rule may be used to reduce the size of the embodiment SAR SRAM cell. (Via-1-to-via-1 space design rule on the same via-1 mask is larger than the via-1-to-via-1 space design rule between via-1 geometries on different DPT via-1 masks.)

In step 88 the via-1s are etched into the IMD-2 layer. They may be partially etched through the IMD-2 layer or they may be etched completely through the IMD-2 layer.

In step 90 the via-1 pattern is removed from the integrated circuit wafer.

In step 92 using the hardmask metal-2 pattern, metal-2 trenches are etched into the IMD-2 layer. At the same time, the via-1s are etched completely through the IMD-2 layer to contact the metal-1 if they were not previously etched through.

In step 94 the integrated circuit is processed through metal-2 deposition and planarization and through additional levels of interconnect if needed followed by protective overcoat and bondpad formation.

The embodiment process flow describes formation of an integrated circuit with an embodiment SAR SRAM cell formed according to principles of the invention. Critical patterns including metal-1, metal-2, contact, and via-1 are DPT compatible in the integrated circuit and also DPT compatible within the SAR SRAM cell. The DPT compatibility within the embodiment SAR SRAM cell is made possible by routing power (Vdd) in the metal-1 level. Those skilled in the art may generate an alternative process flow using DPT compatible contact, metal-1, via-1, and metal-2 patterns within a SAR SRAM cell that are also within the scope of this invention.

Those skilled in the art to which this invention relates will appreciate that many other embodiments and variations are possible within the scope of the claimed invention.

What is claimed is:

1. A method of forming an integrated circuit having an SRAM with a first pass gate transistor, a first pull down transistor, a first pull up transistor, a second pass gate transistor, a second pull down transistor, a second pull up transistor, comprising:
    forming a first contact region of a contact layer, the first contact region extending from a first location overlapping a first gate region of a gate layer to a second location overlapping a shared active region of the first pass gate transistor and the first pull down transistor, the first gate region forming a gate of the second pull up transistor and the second pull down transistor;
    forming a second contact region of the contact layer separated from the first contact region, the second contact region extending from a third location overlapping a second gate region of the gate layer to a fourth location overlapping a first portion of a shared active region of the second pass gate transistor and the second pull down transistor, the second gate region forming a gate of the first pull up transistor and the first pull down transistor;
    forming power routing geometries to route power (Vdd) in a metal-1 layer; and
    forming a first bitline routing and a second bitline routing in a metal-2 layer.

2. The method of claim 1, wherein the contact layer includes a contact plug.

3. The method of claim 1, wherein the contact layer includes a contact liner and a contact plug.

4. The method of claim 1, wherein forming power routing geometries in the metal-1 layer uses a double patterning process.

5. The method of claim 1, wherein forming the first bitline routing and the second bitline routing uses a double patterning process.

6. A method of forming an integrated circuit, comprising:
    forming an SRAM having a first pass gate transistor, a first pull down transistor, a first pull up transistor, a second pass gate transistor, a second pull down transistor, a second pull up transistor, including:
        forming a gate layer having a first gate structure providing a gate of the second pull up transistor and the second pull down transistor and a second gate structure providing a gate of the first pull up transistor and the first pull down transistor;
        forming a contact layer having a first contact extending between a first location vertically co-extensive with the first gate structure and a second location vertically co-extensive with a shared active region of the first pass gate transistor and the first pull down transistor and a second contact separated from the first contact, the second contact connected between a third location vertically co-extensive with the second gate structure and a fourth location vertically co-extensive with a shared active region of the second pass gate transistor and the second pull down transistor;
        forming a metal-1 layer over the contact layer, the metal-1 layer containing
        a power (Vdd) routing, wherein the contact layer extends between the gate layer and the metal-1 layer; and
        forming a metal-2 layer over the metal-1 layer, the metal-2 layer including a first bitline routing and a second bitline routing.

7. The method of claim 6, wherein the contact layer includes a contact plug.

8. The method of claim 6, wherein the contact layer includes a contact liner and a contact plug.

9. The method of claim 6, wherein forming power routing geometries in the metal-1 layer uses a double patterning process.

10. The method of claim 6, wherein forming the first bitline routing and the second bitline routing uses a double patterning process.

11. A method of forming an integrated circuit with a SRAM cell, comprising the steps of:
    forming a first shared active region of a first pass gate transistor and a first pull down transistor and a second shared active region of a second pass gate transistor and a second pull down transistor;
    forming a gate layer having a first gate structure and a second gate structure;
    forming a contact layer using a first double patterning process, including
    printing a first pattern in a resist layer for a contact level;
    subsequently, printing a second pattern in the resist layer for the contact level;
    etching contacts in a pre-metal dielectric layer using the first and second patterns in the resist layer; and
    depositing a contact plug in the contacts, the contacts including a first contact extending between a first location vertically co-extensive with the first gate structure and a second location vertically co-extensive with the first shared active region and a second contact separated from the first contact, the second contact connected between a third location vertically co-extensive with the second gate structure and a fourth location vertically co-extensive with the second shared active region;

forming a via layer;

forming a first metal layer using a second double patterning process, the first metal layer including a power (Vdd) routing in the SRAM cell; and forming a second metal layer using a third double patterning process, the second metal layer including a first bit line routing and a second bit line routing in the SRAM cell.

12. The process of claim 11, wherein the step of forming the gate layer uses a third double patterning process comprising:

printing a third pattern for a gate level over a polysilicon layer;

etching the polysilicon layer using the third pattern to form gate geometries;

printing a fourth pattern for a gate level over the gate geometries; and etching the polysilicon layer with the fourth pattern to cut the gate geometries into separate gates.

* * * * *